(12) United States Patent
Masumoto et al.

(10) Patent No.: US 10,401,993 B2
(45) Date of Patent: Sep. 3, 2019

(54) MULTILAYER STRUCTURE, METHOD OF MANUFACTURING MULTILAYER STRUCTURE, AND IMAGE DISPLAY DEVICE

(71) Applicant: Alps Alpine Co., Ltd., Ota-ku, Tokyo (JP)

(72) Inventors: Yoshifumi Masumoto, Niigata-ken (JP); Kiyoshi Kobayashi, Niigata-ken (JP); Masayoshi Takeuchi, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 67 days.

(21) Appl. No.: 15/813,003

(22) Filed: Nov. 14, 2017

(65) Prior Publication Data
US 2018/0067574 A1 Mar. 8, 2018

Related U.S. Application Data

(63) Continuation of application No. PCT/JP2016/065277, filed on May 24, 2016.

(30) Foreign Application Priority Data

Jul. 28, 2015 (JP) ................. 2015-148750

(51) Int. Cl.
| | |
|---|---|
| *G06F 3/041* | (2006.01) |
| *G02B 5/30* | (2006.01) |
| *G02F 1/1333* | (2006.01) |
| *H01L 27/32* | (2006.01) |
| *H01L 51/52* | (2006.01) |
| *G02F 1/13363* | (2006.01) |
| *G06F 3/044* | (2006.01) |

(52) U.S. Cl.
CPC ............. *G06F 3/041* (2013.01); *G02B 5/30* (2013.01); *G02B 5/3025* (2013.01);
(Continued)

(58) Field of Classification Search
CPC ........ G06F 3/041; G06F 3/0412; G06F 3/044; G06F 2203/04103; G02B 5/30;
(Continued)

(56) References Cited

U.S. PATENT DOCUMENTS

| | | |
|---|---|---|
| 6,611,299 B1 | 8/2003 | Fujii et al. |
| 2002/0169267 A1 | 11/2002 | Minakuchi et al. |

(Continued)

FOREIGN PATENT DOCUMENTS

| | | |
|---|---|---|
| JP | 2000-111896 | 4/2000 |
| JP | 2003-207640 | 7/2003 |

(Continued)

OTHER PUBLICATIONS

International Search Report dated Aug. 16, 2016 from International Application No. PCT/JP2016/065277.

*Primary Examiner* — Stephen G Sherman
(74) *Attorney, Agent, or Firm* — Beyer Law Group LLP

(57) ABSTRACT

A multilayer structure includes a touch sensor and an optical functional layer, the touch sensor including a base member and a transparent electrode layer. The optical functional layer includes a phase-difference layer that gives a phase difference to transmitted light (a specific example of the phase-difference layer is a multilayer configuration formed of a ¼λ phase-difference layer and a ½λ phase-difference layer), and a linear polarizing layer. The optical functional layer is positioned such that a surface thereof on the side on which the phase-difference layer is present faces the touch sensor. In the optical functional layer, the ratio of a retardation at a wavelength of 450 nm to a retardation at a wavelength of 590 nm is less than 0.763, and the slow axis of the base member extends in a direction parallel to the slow axis of the optical functional layer.

9 Claims, 5 Drawing Sheets

(52) U.S. Cl.
CPC .......... *G02F 1/1333* (2013.01); *G06F 3/0412* (2013.01); *H01L 27/323* (2013.01); *H01L 51/5281* (2013.01); *G02F 1/13338* (2013.01); *G02F 1/13363* (2013.01); *G06F 3/044* (2013.01); *G06F 2203/04103* (2013.01)

(58) Field of Classification Search
CPC . G02B 5/3025; H01L 27/323; H01L 51/5281; G02F 1/1333; G02F 1/13338; G02F 1/13363
See application file for complete search history.

(56) References Cited

U.S. PATENT DOCUMENTS

| | | | |
|---|---|---|---|
| 2009/0002580 A1 | 1/2009 | Matsushima et al. | |
| 2010/0073313 A1* | 3/2010 | Iijima | G02F 1/13338 345/173 |
| 2010/0141873 A1* | 6/2010 | Kinjo | G02B 5/3083 349/96 |
| 2011/0063257 A1* | 3/2011 | Nojiri | G06F 3/041 345/175 |
| 2011/0205471 A1* | 8/2011 | Wang | G02F 1/133502 349/96 |
| 2015/0009429 A1* | 1/2015 | Unno | G02F 1/1333 349/12 |
| 2015/0372026 A1* | 12/2015 | Sato | H01L 27/1255 257/71 |
| 2016/0357286 A1* | 12/2016 | Tsai | G06F 3/044 |

FOREIGN PATENT DOCUMENTS

| | | |
|---|---|---|
| JP | 2003-240948 | 8/2003 |
| JP | 2008-249943 | 10/2008 |
| JP | 2014-142462 | 8/2014 |

* cited by examiner

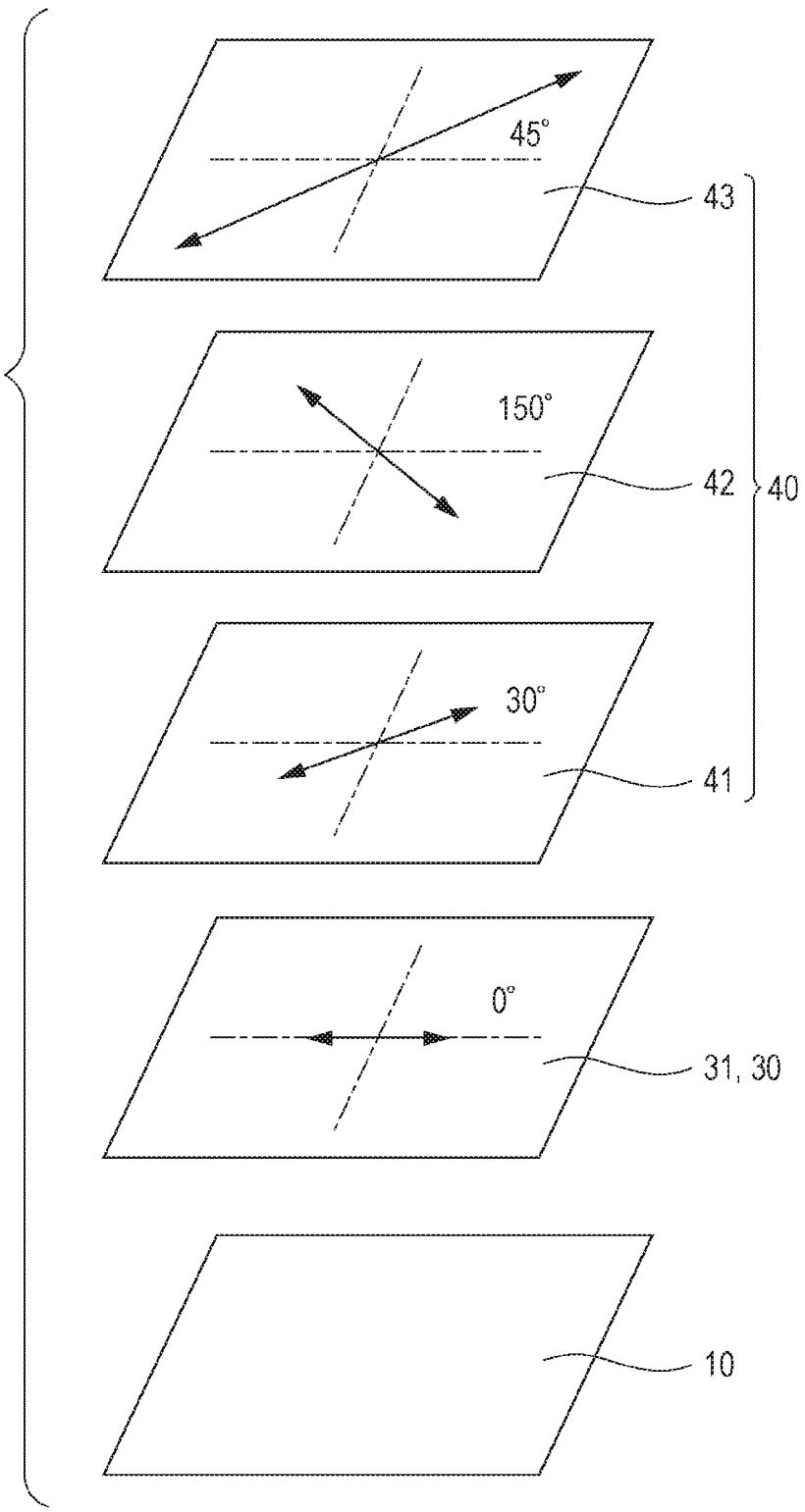

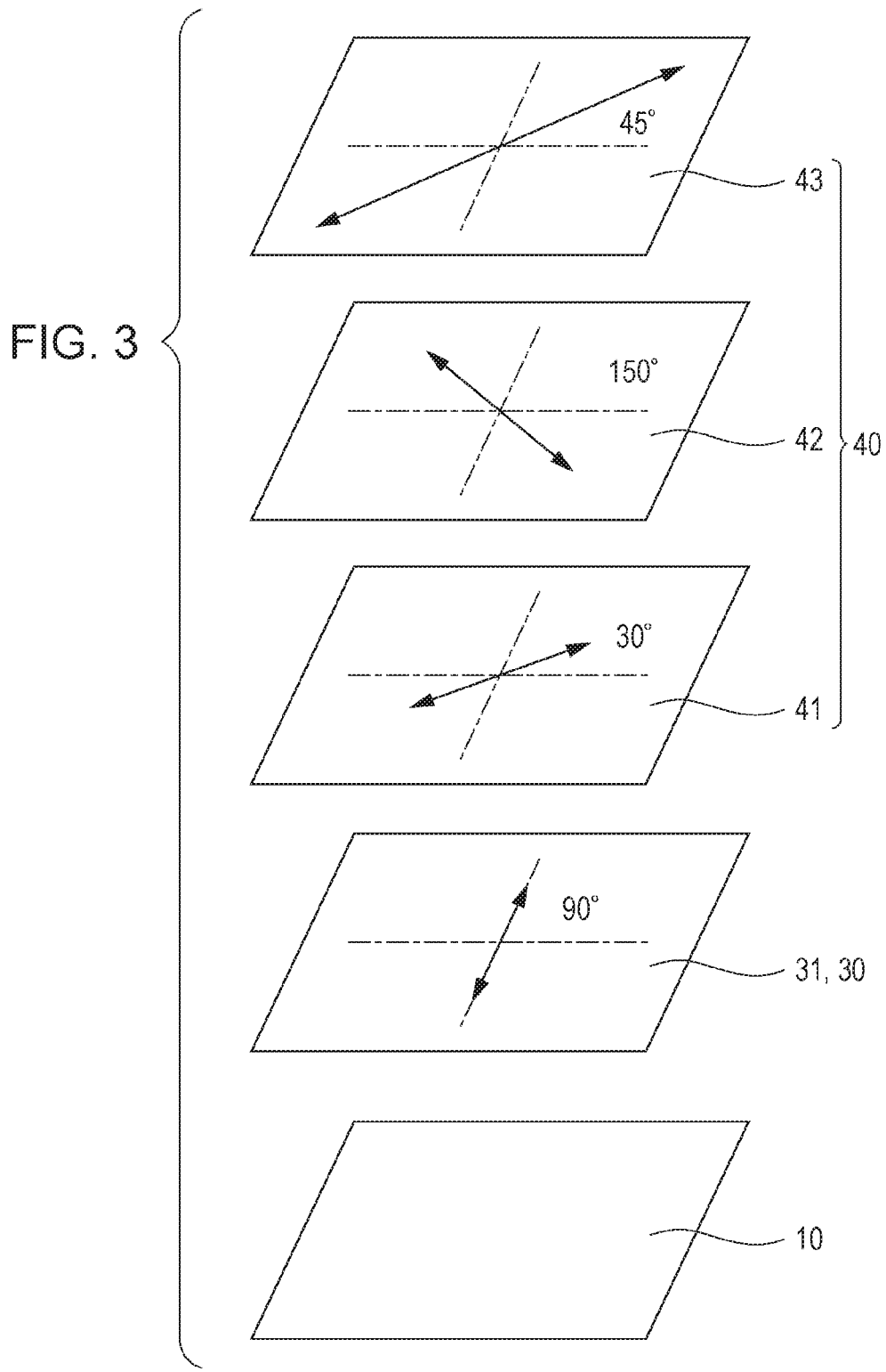

| Comparative Multilayer Structure | $C^*_0$ | | 4.48 | |
|---|---|---|---|---|
| Re/nm | $C^*_1$ | | RC* | |
| | Parallel Arrangement | Perpendicular Arrangement | Parallel Arrangement | Perpendicular Arrangement |
| 2.5 | 4.41 | 4.91 | 0.98 | 1.10 |
| 3.4 | 4.43 | 4.96 | 0.99 | 1.11 |
| 3.9 | 4.35 | 5.13 | 0.97 | 1.15 |
| 4.6 | 4.42 | 5.11 | 0.99 | 1.14 |
| 4.8 | 4.40 | 5.14 | 0.98 | 1.15 |
| 6.3 | 4.38 | 5.25 | 0.98 | 1.17 |
| 7.2 | 4.43 | 5.62 | 0.99 | 1.25 |
| 8.6 | 4.47 | 5.76 | 1.00 | 1.29 |
| 10.6 | 4.49 | 5.93 | 1.00 | 1.32 |
| 13.2 | 4.59 | 6.37 | 1.03 | 1.42 |

MULTILAYER STRUCTURE, METHOD OF MANUFACTURING MULTILAYER STRUCTURE, AND IMAGE DISPLAY DEVICE

CLAIM OF PRIORITY

This application is a Continuation of International Application No. PCT/JP2016/065277 filed on May 24, 2016, which claims benefit of Japanese Patent Application No. 2015-148750 filed on Jul. 28, 2015. The entire contents of each application noted above are hereby incorporated by reference.

BACKGROUND OF THE INVENTION

1. Field of the Invention

The present invention relates to a multilayer structure, a method of manufacturing the multilayer structure, and an image display device, and more particularly to a multilayer structure that suppresses reflection of outside light by using an optical functional layer provided on a touch sensor, a method of manufacturing the multilayer structure, and an image display device.

2. Description of the Related Art

In a display device in which a touch sensor is mounted on a display panel, it is desirable that a conductive pattern serving as an electrode of the touch sensor be prevented from reflecting outside light and that the conductive pattern be invisible.

Japanese Unexamined Patent Application Publication No. 2014-142462 discloses an electrode unit for a touch panel, the electrode unit including an optical functional layer that is formed on one side of an electrode layer, which includes a transparent base member and a conductive pattern, and that gives a phase difference of ¼ wavelength. With such a configuration, the probability of occurrence of display failures such as the conductive pattern of the touch panel becoming visible due to reflection of extraneous light and glare due to unpleasant metallic luster is reduced.

Here, in a configuration in which a touch panel is provided with an optical functional layer in such a manner as to suppress reflection of extraneous light, extraneous light and light reflected by a reflective body pass through the touch sensor. Thus, naturally, an optical property of a base member of the touch panel affects optical characteristics of reflected light from a display element. Regarding this matter, in Japanese Unexamined Patent Application Publication No. 2014-142462, the influence of the base member of the touch sensor on optical characteristics of reflected light is reduced by reducing the retardation of the base member of the touch sensor.

SUMMARY OF THE INVENTION

The present invention provides a multilayer structure, a method of manufacturing the multilayer structure, and an image display device, the multilayer structure being a structure (multilayer structure) formed of a touch sensor and an optical functional layer stacked one on top of the other and being capable of further suppressing deterioration in optical characteristics of reflected light and further improving the optical characteristics of the reflected light compared with a multilayer structure of the related art. Note that, in the present specification, the term "reflected light" refers to, unless otherwise stated, light that is incident on the inside of the multilayer structure, which includes the optical functional layer, through one of main surfaces of the multilayer structure and that is reflected by a reflective body after passing through the multilayer structure so as to pass through the multilayer structure again and to be emitted outside from the one of the main surfaces of the multilayer structure.

As a result of the studies conducted by the inventor of the present invention in order to solve the above problem, it was newly found that, by causing a base member and an optical functional layer of a touch sensor to optically interact with each other by actively using an optical property of the base member of the touch sensor, deterioration in optical characteristics of reflected light can be further suppressed, and the optical characteristics of the reflected light can be further improved compared with a multilayer structure of the related art.

A multilayer structure according to an aspect of the present invention includes a touch sensor and an optical functional layer provided on the touch sensor. The touch sensor includes a base member and a transparent electrode layer provided on the base member. The optical functional layer includes a phase-difference layer that gives a phase difference to transmitted light and a linear polarizing layer provided on the phase-difference layer. The optical functional layer is positioned in such a manner that a surface of the optical functional layer, the surface being on a side on which the phase-difference layer is present, faces the touch sensor. In the multilayer structure, a ratio of a first retardation at a wavelength of 450 nm to a second retardation at a wavelength of 590 nm is less than 0.763, and a slow axis of the base member extends in a direction parallel to a slow axis of the optical functional layer.

The optical functional layer has a function of converting natural light that is incident thereon into circularly polarized light. With such a configuration, by setting the optical positional relationship between the base member of the touch sensor and the optical functional layer and controlling the retardation of the base member, the optical interaction between the base member of the touch sensor and the optical functional layer may be realized. As a result, deterioration in optical characteristics of reflected light due to the base member of the touch sensor may be suppressed. In addition, according to a preferred embodiment, by causing the base member of the touch sensor to appropriately and optically interact with the optical functional layer, optical characteristics of reflected light may be further improved than those in the case where the optical functional layer is used alone.

In the multilayer body according to the present invention, the phase-difference layer may include a ¼λ phase-difference layer that gives a phase difference of ¼ wavelength to transmitted light and a ½λ phase-difference layer that gives a phase difference of ½ wavelength to transmitted light, the ½λ phase-difference layer being provided on the ¼λ phase-difference layer, and the ½λ phase-difference layer may be positioned in such a manner as to be close to the linear polarizing layer. As a result of the phase-difference layer having the above-described configuration, the optical functional layer in which the ratio is less than 0.763 may be easily obtained.

In the multilayer structure according to the present invention, a retardation of the base member at a wavelength of 590 nm may be 10 nm or less. As a result, suppression of deterioration in optical characteristics of reflected light within a visible-light region and an improvement in the optical characteristics of the reflected light may be further stably facilitated.

The base member may be made of a resin-based material and may have flexibility. The resin-based material may include a cycloolefin-based resin. As a result, suppression of reflected light in the case of using a touch sensor that is capable of being bent may be facilitated.

A method according to another aspect of the present invention of manufacturing a multilayer structure including a touch sensor and an optical functional layer provided on the touch sensor includes stacking the touch sensor and the optical functional layer one on top of the other in such a manner that a ratio of a first retardation at a wavelength of 450 nm to a second retardation at a wavelength of 590 nm in the multilayer structure is less than 0.763; that the optical functional layer includes a phase-difference layer that gives a phase difference to transmitted light and a linear polarizing layer provided on the phase-difference layer; that a surface of the optical functional layer, the surface being on a side on which the phase-difference layer is present, faces the touch sensor; and that a slow axis of a base member of the touch sensor extends in a direction parallel to a slow axis of the optical functional layer.

With such a configuration, by setting the optical positional relationship between the base member of the touch sensor and the optical functional layer and controlling the retardation of the base member, the degree of optical interaction between the base member of the touch sensor and the optical functional layer may be controlled. As a result, deterioration in optical characteristics of reflected light due to the base member of the touch sensor may be suppressed. In addition, according to a preferred embodiment, by causing the base member of the touch sensor to appropriately and optically interact with the optical functional layer, optical characteristics of reflected light may be further improved than those in the case where the optical functional layer is used alone.

In the multilayer body according to the present invention, the phase-difference layer may include a ¼λ phase-difference layer that gives a phase difference of ¼ wavelength to transmitted light and a ½λ phase-difference layer that gives a phase difference of ½ wavelength to transmitted light, the ½λ phase-difference layer being provided on the ¼λ phase-difference layer, and the ½λ phase-difference layer may be positioned in such a manner as to be close to the linear polarizing layer. As a result, the optical functional layer in which the ratio is less than 0.763 may be easily obtained.

In the method of manufacturing a multilayer structure according to the present invention, stacking of the optical functional layer onto the touch sensor may be performed including applying a liquid composition used for forming the optical functional layer onto the touch sensor. As a result, optical characteristics of the optical functional layer may be controlled by applying the liquid composition.

A multilayer structure according to another aspect of the present invention includes a touch sensor and an optical functional layer provided on the touch sensor. The touch sensor includes a base member and a transparent electrode layer provided on the base member. The optical functional layer includes a ¼λ phase-difference layer that gives a phase difference of ¼ wavelength to transmitted light, a ½λ phase-difference layer that gives a phase difference of ½ wavelength to transmitted light, the ½λ phase-difference layer being provided on the ¼λ phase-difference layer, and a linear polarizing layer provided on the ½λ phase-difference layer. The optical functional layer is positioned in such a manner that a surface of the optical functional layer, the surface being on a side on which the ¼λ phase-difference layer is present, faces the touch sensor, and a saturation ratio of a first saturation of reflected light measured by providing a reflective layer on a side of the touch sensor of the multilayer structure and causing light to be incident from a side of the linear polarizing layer to a second saturation of reflected light measured by providing a reflective layer on a side of the ¼λ phase-difference layer of a comparative multilayer structure formed of the optical functional layer and causing light to be incident from a side of the linear polarizing layer, is 1.1 or less.

As a result of the saturation ratio being 1.1 or less, reflected light from the multilayer structure has less color. Therefore, in the case where a light-emitting device is provided between the multilayer structure and a reflective body (a specific example of the light-emitting device is an organic EL device), it is unlikely that a difference in color will occur between light generated by the light-emitting device and light observed after passing through the multilayer structure.

In the above-described multilayer structure according to the present invention, a retardation of the base member of the touch sensor at a wavelength of 590 nm may be 2.5 nm or greater. In the multilayer structure according to the present invention, optical characteristics of reflected light is controlled by using the optical interaction between the base member of the touch sensor and the optical functional layer. Therefore, there is a case where it is preferable that the base member of the touch sensor have a reasonable retardation from the standpoint of improving the controllability of optical characteristics of reflected light.

In the multilayer structure according to the present invention, a retardation of the base member of the touch sensor at a wavelength of 590 nm may be 7.9 nm or less. In this case, it is likely that advantageous effects provided by the optical interaction between the base member of the touch sensor and the optical functional layer will be further stably obtained. In other words, it is likely that an improvement in optical characteristics of reflected light will be further stably facilitated than those in the case where the optical functional layer is used alone.

In the multilayer structure according to the present invention, the slow axis of the base member may extend in a direction parallel to the slow axis of the optical functional layer or in a direction perpendicular to the slow axis of the optical functional layer. In the case where the relationship between the slow axis of the base member and the slow axis of the optical functional layer is a perpendicular relationship or a parallel relationship, the optical interaction between the base member and the optical functional layer may be easily increased. It is determined, depending on the configuration of the optical functional layer or the like, whether the perpendicular relationship or the parallel relationship is preferable.

A method of manufacturing the multilayer structure according to another aspect of the present invention includes stacking the touch sensor and the optical functional layer one on top of the other in such a manner that an angle formed by the slow axis of the base member included in the touch sensor and the slow axis of the optical functional layer is set to be an angle at which the saturation ratio is 1.1 or less. As a result, by setting the optical positional relationship between the base member of the touch sensor and the optical functional layer and controlling the retardation of the base member, the degree of optical interaction between the base member of the touch sensor and the optical functional layer may be controlled. As a result, deterioration in optical characteristics of reflected light due to the base member of the touch sensor may be suppressed. In addition, according to a preferred embodiment, as a result of the base member of the touch sensor to appropriately interacting with the optical functional layer, optical characteristics of reflected light may be further improved than those in the case where the optical functional layer is used alone.

In the method of manufacturing the multilayer structure according to the present invention, stacking of the optical functional layer onto the touch sensor may be performed including applying a liquid composition used for forming the optical functional layer onto the touch sensor. As a result, optical characteristics of the optical functional layer may be controlled by applying the liquid composition.

An image display device according to another aspect of the present invention includes the above-described multilayer structure and an image display unit provided on a surface of the multilayer structure, the surface being on a side on which the touch sensor is disposed. The image display unit is disposed in such a manner that an image display surface of the image display unit faces the multilayer structure. The image display unit may be an organic EL panel. With such a configuration, deterioration in optical characteristics of reflected light due to the base member of the touch sensor may be suppressed. In addition, according to a preferred embodiment, as a result of the base member of the touch sensor appropriately interacting with the optical functional layer, optical characteristics of reflected light may be further improved than those in the case where the optical functional layer is used alone.

According to the present invention, a multilayer structure capable of suppressing deterioration in optical characteristics of reflected light and improving the optical characteristics of the reflected light, a method of manufacturing the multilayer structure, and an image display device can be provided.

BRIEF DESCRIPTION OF THE DRAWINGS

FIG. 2 is an exploded perspective view illustrating a configuration example of a touch sensor and an optical functional layer;

FIG. 3 is an exploded perspective view illustrating another configuration example of the touch sensor and the optical functional layer;

DESCRIPTION OF THE PREFERRED EMBODIMENTS

An embodiment of the present invention will be described below with reference to the drawings. Note that, in the following description, the same members are denoted by the same reference signs, and repeated descriptions thereof will be suitably omitted.

(Configuration of Image Display Device)

Figure 1:
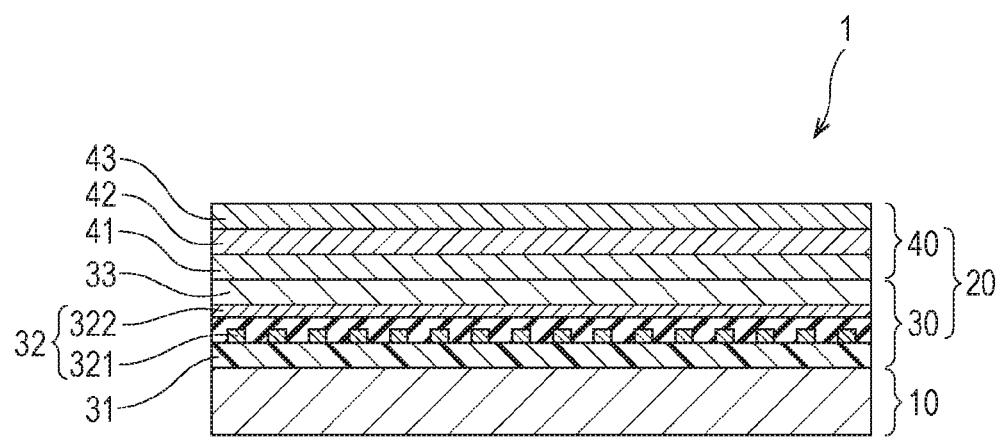
FIG. 1 is a cross-sectional view illustrating an example of the configuration of an image display device.

FIG. 1 is a cross-sectional view illustrating an example of the configuration of an image display device 1. The image display device 1 includes an image display unit 10 that uses, for example, liquid crystal or organic electroluminescence (EL) and a multilayer structure 20 that is provided on the image display unit 10. The multilayer structure 20 includes a touch sensor 30 and an optical functional layer 40 that is provided on the touch sensor 30. In other words, the image display device 1 according to the present embodiment is a touch-panel display.

The touch sensor 30 includes a base member 31 and a transparent electrode layer 32 that is provided on the base member 31. A resin-based material having flexibility (e.g., a polycarbonate (PC), a cycloolefin polymer (COP), or triacetylcellulose (TAC)) may be used as a material of the base member 31. In particular, it is desirable that a material including a cycloolefin-based resin be used as the resin-based material of the base member 31 from the standpoint of optical characteristics. In addition, it is desirable that the retardation of the base member 31 at a wavelength of 590 nm be 10 nm or less.

The transparent electrode layer 32 includes a plurality of first electrodes 321 and a plurality of second electrodes 322 that cross each other. Here, the term "transparent" refers to enabling a sufficient amount (e.g., 50% or more) of light within a visible-light region to pass through the transparent electrode layer 32. For example, indium tin oxide (ITO) is used as a material of the transparent electrode layer 32. A cover 33 is provided on the transparent electrode layer 32. In the touch sensor 30, the position of a finger on the touch sensor 30 is detected by, for example, detecting a change in an electrostatic capacitance when the finger is brought closer to the touch sensor 30.

The optical functional layer 40 includes a ¼λ phase-difference layer 41, a ½λ phase-difference layer 42, and a linear polarizing layer 43. The ¼λ phase-difference layer 41 gives a phase difference of ¼ wavelength to transmitted light. The ½λ phase-difference layer 42 gives a phase difference of ½ wavelength to transmitted light. The linear polarizing layer 43 converts transmitted light into linearly polarized light having a polarizing axis extending in a direction perpendicular to an absorption axis. Note that, among the layers included in the optical functional layer 40, the layers that are provided for giving a phase difference may sometimes be collectively called a phase-difference layer. In the optical functional layer 40 according to the present embodiment, the phase-difference layer may be formed of the ¼λ phase-difference layer 41 and the ½λ phase-difference layer 42. In the optical functional layer 40, the ¼λ phase-difference layer 41, the ½λ phase-difference layer 42, and the linear polarizing layer 43 are arranged in this order from the side of the touch sensor 30. In other words, in the optical functional layer 40, the ¼λ phase-difference layer 41 may be positioned in such a manner as to face the touch sensor 30. The ½λ phase-difference layer 42 may be positioned on the ¼λ phase-difference layer 41. The linear polarizing layer 43 may be positioned on the ½λ phase-difference layer 42.

In the present embodiment, when the retardation at a wavelength of 590 nm and the retardation at a wavelength of 450 nm are respectively denoted by reference signs Re1 and Re2, and the ratio of Re2 to Re1 is denoted by reference sign RR, the ratio RR in the retardation of the optical functional layer 40 is less than 0.763. When the ratio RR is 0.763, it is very likely that ideal wavelength-dispersion characteristics of an optical element (a circular polarizing element) that provides circular polarization is obtained. The slow axis of birefringence in the base member 31 of the touch sensor 30 extends in a direction parallel to the slow axis of birefringence in the optical functional layer 40.

Deterioration in optical characteristics of reflected light can be suppressed by setting the optical positional relationship between the touch sensor 30 and the optical functional layer 40 and the retardation of the optical functional layer 40. In a preferred example of the present embodiment, an optical interaction between the base member 31 of the touch sensor 30 and the optical functional layer 40 is realized by actively using the retardation of the base member 31 and the retardation of the optical functional layer 40, so that optical characteristics of reflected light can be further improved than those in the case where the optical functional layer 40 is used alone.

(Configuration of Each Layer)

FIG. 2 and FIG. 3 are exploded perspective views each illustrating a configuration example of the touch sensor 30 and the optical functional layer 40. In the configuration examples illustrated in FIG. 2 and FIG. 3, the touch sensor 30 is positioned on the image display unit 10. Among the components of the touch sensor 30, only the base member 31 is illustrated in FIG. 2 and FIG. 3 for convenience of description. As the optical functional layer 40, the ¼λ phase-difference layer 41, the ½λ phase-difference layer 42, and the linear polarizing layer 43 are provided on the base member 31 in this order.

The angle of the absorption axis of the linear polarizing layer 43 is 45 degrees. The angle of the slow axis of the ½λ phase-difference layer 42 is 150 degrees. The angle of the slow axis of the ¼λ phase-difference layer 41 is 30 degrees. On the whole, the optical functional layer 40 has a ¼λ phase difference showing reverse wavelength-dispersion characteristics, and the angle of a synthesized slow axis is 0 degrees.

FIG. 2 illustrates an arrangement in which the angle of the slow axis of the base member 31 of the touch sensor 30 is 0 degrees with respect to the optical functional layer 40. In other words, FIG. 2 illustrates a case where the slow axis of the base member 31 of the touch sensor 30 extends in a direction parallel to the slow axis of the optical functional layer 40. In the present embodiment, this arrangement will be referred to as parallel arrangement.

FIG. 3 illustrates an arrangement in which the angle of the slow axis of the base member 31 of the touch sensor 30 is 90 degrees with respect to the optical functional layer 40. In other words, FIG. 3 illustrates a case where the slow axis of the base member 31 of the touch sensor 30 extends in a direction perpendicular to the slow axis of the optical functional layer 40. In the present embodiment, this arrangement will be referred to as perpendicular arrangement.

Figure 4A:
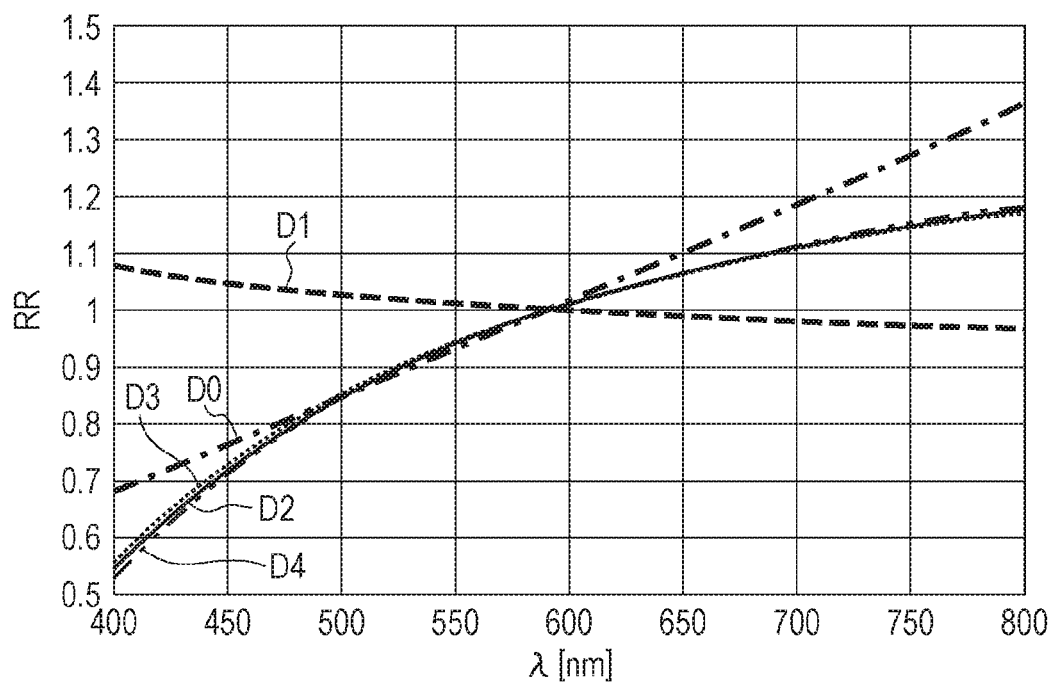
FIGS. 4A and 4B are graphs illustrating a wavelength dependence of a ratio in retardation.
Figure 4B:
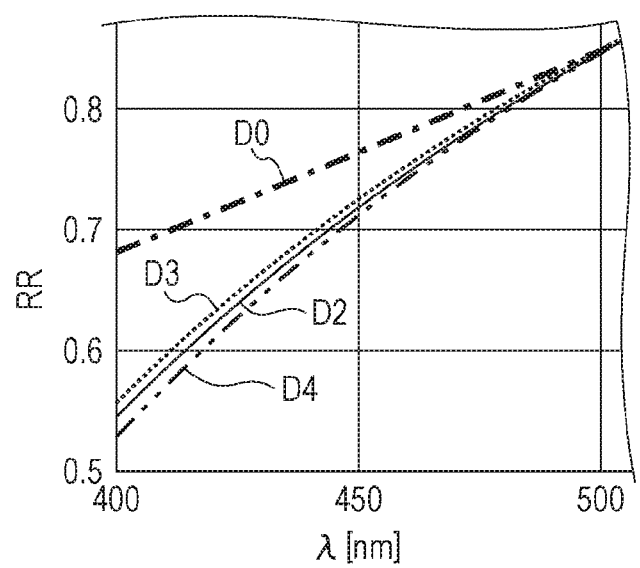

FIGS. 4A and 4B are graphs illustrating a wavelength dependence of the ratio RR in retardation. FIG. 4B is an enlarged view of a portion of FIG. 4A. In FIGS. 4A and 4B, data D0 shows retardation ratio RR in an ideal circular polarizing element for suppressing reflected light, data D1 shows retardation ratio RR in the base member 31 of the touch sensor 30, data D2 shows retardation ratio RR in the optical functional layer 40, data D3 shows retardation ratio RR including the optical functional layer 40 and the base member 31 in the parallel arrangement, and data D4 shows retardation ratio RR including the optical functional layer 40 and the base member 31 in the perpendicular arrangement. The data D0 is a calculation result obtained by an optical simulation, and each of the data D1 to the data D4 is actually measured data.

As illustrated in FIG. 4B, in the optical functional layer 40 according to the present embodiment, it is understood that the parallel arrangement (data D3) is closer to an ideal state (data D0) than the perpendicular arrangement (data D4) is. In particular, the parallel arrangement (data D3) is closer to the ideal state (data D0) than the case in which the optical functional layer 40 is used alone (data D2) is. Consequently, in the above-described configuration of the optical functional layer 40 (the ¼λ phase-difference layer 41, the ½λ phase-difference layer 42, and the linear polarizing layer 43), by providing the base member 31 of the touch sensor 30 in the parallel arrangement, characteristics that is closer to wavelength-dispersion characteristics of the retardation of an ideal circular polarizing element than those in the case in which the optical functional layer 40 is used alone can be obtained. Therefore, as a result of using the multilayer structure 20 according to the present embodiment, it is expected that deterioration in optical characteristics of reflected light will be suppressed and that the optical characteristics of the reflected light will be improved.

Figures 5, 6:
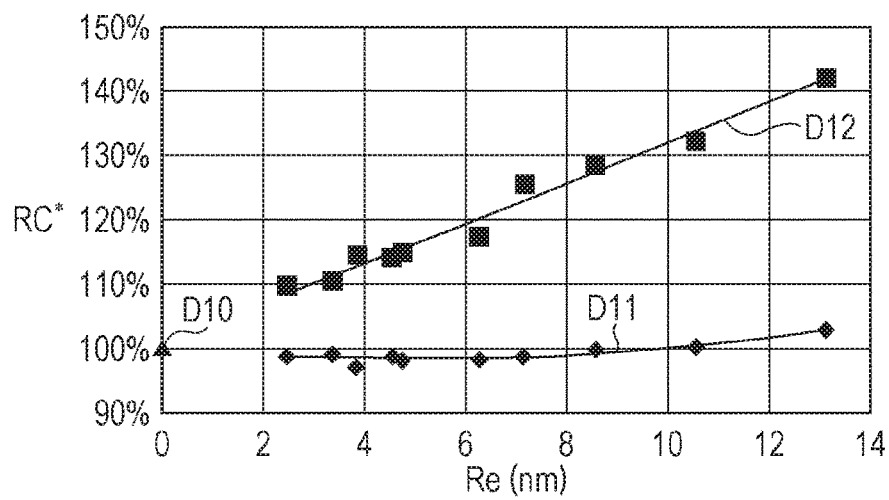
FIG. 5 is a table showing measurement results of the saturation of reflected light.
FIG. 6 is a graph illustrating saturation ratio.

FIG. 5 is a table showing measurement results of saturation, which is one of optical characteristics of reflected light. For the saturation, a formula of $C^* = ((a^*)^2 + (b^*)^2)^{0.5}$ in the $L^*a^*b^*$ color space is used. In FIG. 5, in each of a multilayer structure (parallel multilayer structure) in the parallel arrangement and a multilayer structure (perpendicular multilayer structure) in the perpendicular arrangement, the saturation $C^*1$ of reflected light was measured by providing a reflective layer on the side of the touch sensor 30 and causing light to be incident from the side of the linear polarizing layer 43. In addition, a comparative multilayer structure (a multilayer structure that is formed of an optical functional layer having the same configuration as that of the optical functional layer 40 included in the multilayer structure 20 according to the present embodiment, that is, a multilayer structure having a structure obtained by removing the touch sensor 30 from the multilayer structure 20 according to the present embodiment) was prepared, and the saturation $C^*0$ of reflected light was measured by providing a reflective layer was provided on the side of a ¼λ phase-difference layer in the comparative multilayer structure and causing light to be incident from the side of a linear polarizing layer.

First, in the comparative multilayer structure (a multilayer structure that is formed of only the optical functional layer 40), the saturation $C^*0$ of reflected light was 4.48. Regarding the saturation $C^*1$ of reflected light in the parallel multilayer structure and the saturation $C^*1$ of reflected light in the perpendicular multilayer structure, measurement was performed in the parallel arrangement (the parallel multilayer structure) and the perpendicular arrangement (the perpendicular multilayer structure) by varying the retardation of the base member 31 of the touch sensor 30 at a wavelength of 590 nm (the column Re in FIG. 5) within a range of 2.5 nm to 13.2 nm. FIG. 5 also shows saturation ratio $RC^*$ based on the saturation $C^*1$ and the saturation $C^*0$ in the comparative multilayer structure.

FIG. 6 illustrates a graphical representation of the saturation ratios $RC^*$ shown in FIG. 5. In FIG. 6, data D10 shows the saturation ratio $RC^*$ in the case where the touch sensor 30 is not provided (the comparative multilayer structure), data D11 shows the saturation ratio $RC^*$ in the parallel multilayer structure, and data D12 shows the saturation ratio $RC^*$ in the perpendicular multilayer structure.

It is understood from the measurement results that in the parallel multilayer structure, which corresponds to the multilayer structure 20 according to the present embodiment, an increase in the saturation $C^*1$ of the reflected light can be effectively suppressed, whereas in the perpendicular multilayer structure, an increase in the saturation $C^*1$ of the reflected light is not effectively suppressed. An increase in the saturation $C^*1$ of reflected light implies that color misregistration becomes notable, and thus, it can be said that deterioration in optical characteristics of reflected light is suppressed in the parallel multilayer structure, whereas in the perpendicular multilayer structure, deterioration in optical characteristics of reflected light is not suppressed.

More specifically, in the case where an optical functional layer, which is used for realizing circular polarization, includes the ¼λ phase-difference layer 41 and the ½λ phase-difference layer 42 like the optical functional layer 40 of the multilayer structure 20 according to the present embodiment, even if the retardation of the base member 31 is high (e.g., 10 nm or greater), the saturation ratio RC* is 1.1 or less in the parallel arrangement. In contrast, in the perpendicular multilayer structure, even if the retardation of the base member 31 is reduced (e.g., 5 nm or less), it is not easy to set the saturation ratio RC* to 1.1 or less.

In order to reduce the retardation of the base member 31, it is necessary to particularly reduce the thickness of the base member 31 or to devise a manufacturing method (e.g., a method for making the base member 31 non-stretchable) for, for example, reducing birefringence distribution in the base member 31. Therefore, when using a base member having a low retardation, along with the low handleability of the base member, the productivity in manufacturing a multilayer structure and the quality of a multilayer structure are likely to decrease, and in addition, the manufacturing costs of a multilayer structure including the base member are likely to increase. The multilayer structure 20 according to the present embodiment can suppress deterioration in optical characteristics of reflected light without particularly being provided with a base member having a low retardation.

Since the multilayer structure 20 according to the present embodiment is in the parallel arrangement, when the retardation of the base member 31 is 10 nm or less, the saturation ratio RC* is 1.0 or less. In other words, as a result of the retardation of the base member 31 being 10 nm or less, reflected light has optical characteristics equal to or better than those in the case where the touch sensor 30 is not provided.

In particular, in the multilayer structure 20 according to the present embodiment, when the retardation of the base member 31 at a wavelength of 590 nm is 2.5 nm or greater and 7.2 nm or less, the saturation ratio RC* is less than 1.00. Thus, in the multilayer structure 20 according to the present embodiment, the hue of reflected light is lighter than that in the case where the touch sensor 30 is not provided (the comparative multilayer structure). As described above, in the multilayer structure 20 according to the present embodiment, by actively using the optical interaction between the optical functional layer 40 and the base member 31 of the touch sensor 30, optical characteristics of reflected light can be further improved than those in the case where the touch sensor 30 is not provided. From the standpoint of further stably improving optical characteristics of reflected light, it is preferable that the retardation of the base member 31 at a wavelength of 590 nm be 2.5 nm or greater and 6.3 nm or less, or more preferably, 3.4 nm or greater and 6.3 nm or less.

(Method of Manufacturing Multilayer Structure)

The multilayer structure 20 according to the present embodiment may be manufactured by, for example, the following method. First, the first electrodes 321 and the second electrodes 322, which form the transparent electrode layer 32, are formed on the base member 31 of the touch sensor 30. The first electrodes 321 and the second electrodes 322 are formed in such a manner as to cross each other with an insulating layer interposed therebetween. Subsequently, the cover 33 is formed on the transparent electrode layer 32. As a result, the touch sensor 30 is formed.

Next, the optical functional layer 40 is formed on the touch sensor 30. The optical functional layer 40 is formed by stacking, on the touch sensor 30, the ¼λ phase-difference layer 41, the ½λ phase-difference layer 42, and the linear polarizing layer 43 on top of one another in this order. Each of the ¼λ phase-difference layer 41, the ½λ phase-difference layer 42, and the linear polarizing layer 43 may be formed of an alignment film to which desired optical characteristics have been imparted by a method such as stretching. In this case, the optical functional layer 40 can be formed by stacking a plurality of alignment films on top of one another with an adhesive or a sticky agent. Alternatively, the optical functional layer 40 may be formed by preparing an alignment film having an alignment direction that corresponds to a phase difference and applying a liquid composition (e.g., liquid crystal) onto the alignment film. The touch sensor 30 and the optical functional layer 40 may be fixed (adhered or sticked) to each other by using an optically transparent material, or the optical functional layer 40 may be fixed (adhered or sticked) to the touch sensor 30 by using a material that forms part of the optical functional layer 40. As a result, manufacture of the multilayer structure 20 in which the optical functional layer 40 is stacked on the touch sensor 30 is completed.

As described above, according to the embodiment, the multilayer structure 20 in which deterioration in optical characteristics of reflected light due to the base member 31 of the touch sensor 30 is suppressed may be provided. In addition, according to a preferred embodiment, the multilayer structure 20 may be provided in which, as a result of the base member 31 of the touch sensor 30 appropriately interacting with the optical functional layer 40, optical characteristics of reflected light are further improved than those in the case where the optical functional layer 40 is used alone. Furthermore, according to the present embodiment, a method of manufacturing the multilayer structure 20 and the image display device 1 can be provided.

Note that, although the present embodiment has been described above, the present invention is not limited to these examples. For example, addition and removal of components and design changes may be suitably made to the above-described embodiment by those skilled in the art, and features of the configuration examples according to the embodiments may be suitably combined with each other. Such embodiments are also within the scope of the present invention as long as they have the features of the present invention.

For example, in the above-described embodiment, the phase-difference layer formed of the ¼λ phase-difference layer 41 and the ½λ phase-difference layer 42 may have a single-layer configuration or may have three or more layers. From the standpoint of easily setting the ratio RR of the optical functional layer 40 to be less than 0.763, it is preferable that the phase-difference layer have a multilayer configuration. Therefore, from the standpoint of easily setting the ratio RR of the optical functional layer 40 to be less than 0.763 while reducing the number of layers that form the optical functional layer 40 as small as possible, it is preferable that the phase-difference layer be formed of the ¼λ phase-difference layer 41 and the ½λ phase-difference layer 42 as in the above-described embodiment.

What is claimed is:

1. A multilayer structure comprising:
   a touch sensor including a base member and a transparent electrode layer formed thereon; and
   an optical functional layer provided on an upper surface of the touch sensor the optical functional layer having a laminated structure including:
   a ¼λ phase-difference layer facing the upper surface of the touch sensor, the ¼λ phase-difference layer providing a phase difference of ¼ wavelength to light being transmitted therethrough; and
   a ½λ phase-difference layer formed on the ¼λ phase-difference layer, the ½λ phase-difference layer providing a phase difference of ½ wavelength to the light being transmitted therethrough; and
   a linear polarizing layer provided on the ½λ phase-difference layer,
   wherein the multilayer structure has a first saturation measured for reflected light that is incident upon the multilayer structure from the linear polarization layer and reflected by a reflective layer provided behind the touch sensor, while the optical functional layer has a second saturation measured for reflected light that is incident upon the optical functional layer from the linear polarization layer and reflected by a reflective layer provided behind the ¼λ phase-difference layer, and
   wherein a saturation ratio of the first saturation to the second saturation is equal to or smaller than 1.1.

2. The multilayer structure according to claim 1, wherein a retardation of the base member of the touch sensor at a wavelength of 590 nm is equal to or greater than 2.5 nm.

3. The multilayer structure according to claim 2, wherein the retardation of the base member of the touch sensor at a wavelength of 590 nm is equal to or smaller than 7.2 nm.

4. The multilayer structure according to claim 1, wherein a retardation of the base member of the touch sensor at a wavelength of 590 nm is equal to or smaller than 7.2 nm.

5. The multilayer structure according to claim 1, wherein a slow axis of the base member extends in a direction parallel to a slow axis of the optical functional layer or in a direction perpendicular to the slow axis of the optical functional layer.

6. A method for manufacturing the multilayer structure according to claim 1, the base member having a first slow axis and the optical functional layer having a second slow axis, the method comprising:
   providing the optical functional layer on the touch sensor such that the first slow axis of the base member and the second slow axis of the optical functional layer have an angle that provides the saturation ratio equal to or smaller than 1.1.

7. The method according to claim 6, wherein the providing the optical functional layer on the touch sensor includes:
   applying a liquid composition for forming the optical functional layer onto the touch sensor.

8. An image display device comprising:
   an image display unit having an image display surface; and
   the multilayer structure of claim 1 provided on the image display unit such that the touch sensor faces the image display surface.

9. The image display device according to claim 8, wherein the image display unit includes an organic electroluminescence panel.

* * * * *